United States Patent
Terletzki et al.

(10) Patent No.: US 6,958,626 B2
(45) Date of Patent: Oct. 25, 2005

(54) OFF CHIP DRIVER

(75) Inventors: Hartmud Terletzki, Graz (AT); Gerd H. Frankowsky, Höhenkirchen-Siegertsbrunn (DE); Gunther R. Lehmann, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/631,394

(22) Filed: Jul. 31, 2003

(65) Prior Publication Data

US 2005/0024090 A1 Feb. 3, 2005

(51) Int. Cl.[7] .................................. H03K 19/0175
(52) U.S. Cl. ............................... 326/83; 326/81
(58) Field of Search .................... 326/80–90

(56) References Cited

U.S. PATENT DOCUMENTS

| | | | |
|---|---|---|---|
| 4,791,326 A | * 12/1988 | Vajdic et al. | ............. 327/391 |
| 5,864,506 A | 1/1999 | Arcoleo et al. | |
| 5,939,937 A | 8/1999 | Terletzki | |
| 5,955,894 A | 9/1999 | Vishwanthaiah et al. | |
| 6,353,338 B1 | * 3/2002 | Fiedler et al. | ............. 326/83 |
| 6,459,300 B1 | 10/2002 | Terletzki | |
| 6,501,298 B1 | 12/2002 | Terletzki | |

* cited by examiner

Primary Examiner—Don Le
(74) Attorney, Agent, or Firm—Slater & Matsil, L.L.P.

(57) ABSTRACT

A system and method is provided for controlling the impedance and current of an off chip driver circuit to match to load driven by the driver and for reducing noise and ringing in the off chip driver circuit. The driver comprises a pull up transistor for switching the output of the driver to a high-voltage, a pull down transistor for switching the output of the driver to a low voltage, a first current mirror transistor coupled to the pull up transistor for controlling the current transmitted to a load connected to the driver when the output of the driver is at the high-voltage, and a second current mirror transistor coupled to the pull down transistor for controlling the current transmitted to the load when the output of the driver is at the low voltage. In addition, the driver may include a first pre-driver providing a gate signal for the pull up transistor having a controlled slew rate and a second pre-driver providing a gate signal for the pull down transistor having a controlled slew rate.

36 Claims, 8 Drawing Sheets

OFF CHIP DRIVER

FIELD OF THE INVENTION

The present invention relates to an off chip driver circuit and, in particular, to a system and method for controlling the impedance and current of an off chip driver circuit to match the load driven by the driver. The present invention further relates to a system and method for reducing noise and ringing in an off chip driver circuit.

BACKGROUND OF THE INVENTION

Semiconductor chips, such as semiconductor memory chips and semiconductor processor chips, generate logical high signals and logical low signals that eventually must be transmitted to one or more devices ("the load") located off of the chip. In order to transmit these output signals to the load, the chip includes an off chip driver circuit that receives the chip's output signals and transmits these signals to the load. The driver circuit generally is fabricated using P-channel and N-channel field effect transistors (FETs) and, in particular, metal oxide semiconductor (MOS) or complementary metal oxide semiconductor (CMOS) transistors. The P-channel transistor acts as a "pull up" transistor to pull the output voltage up to the high logical level, and the N-channel transistor acts as a "pull down" transistor to pull the output voltage down to the low logical level.

The driver's output signals preferably are transmitted to the load at a drive current and output impedance appropriate to the load. Since the driver's output impedance is directly related to the driver's drive current, modifying the driver's drive current also modifies the driver's output impedance. By modifying the driver's drive current, therefore, the driver's output impedance can be set to match the input impedance of the load. A failure to match the driver's output impedance to the input impedance of the load can cause unwanted signal reflections, voltage overshoots, voltage undershoots and timing problems.

Several methods have been employed in the past for modifying the drive current of an off chip driver circuit. For example, as shown in U.S. Pat. No. 5,864,506, the off chip driver circuit may include a plurality of identical elements. Each element comprises a P-channel transistor and an N-channel transistor connected at their drains. The drain connection also serves as a terminal for the driver's output signal. The P-channel transistor of each element acts as a pull up transistor for the output signal, and the N-channel transistor of each element acts as a pull down transistor for the output signal. A selected number of these elements are activated using additional transistors and a control signal generator. Depending upon the number of such elements activated, the drive current is increased or decreased. The system disclosed in U.S. Pat. No. 5,955,894 is similar. In this system, the pull up circuit comprises a plurality of identical elements, and the pull down circuit comprises a plurality of identical elements. Each element of the pull up circuit and each element of the pull down circuit are individually activated using control logic.

A problem with these prior art systems is that the additional circuitry of the plurality of elements adds unwanted capacitance to the output impedance. Also, in order to switch rapidly between the high logical level and the low logical level (slope<1 V/ns), the circuits within the driver for the pull up and pull down paths must be oversized. This oversizing undesirably increases the DC output impedance of the driver. Also, the rapid switching generates noise on the output signal and ringing on the power buses.

SUMMARY OF THE INVENTION

The present invention provides an off chip driver circuit that avoids these problems and provides highly accurate control of output impedance and rapid switching between the high and low logical levels without the generation of noise and ringing. This performance is achieved by coupling to both the pull up transistor and the pull down transistor an additional transistor that acts as a current mirror transistor and by controlling the slew rate (rate of change of output voltage) of the gate signals driving the pull up and pull down transistors. The pull up transistor's current mirroring transistor controls the driver's drive current (and output impedance) during the high logical level, and the pull down transistor's current mirroring transistor controls the driver's drive current (and output impedance) during the low logical level. By controlling the current that the current mirroring transistors mirror, the driver's drive current (and output impedance) also is controlled. By controlling the slew rate of the gate signals driving the pull up and pull down transistors, noise and ringing during switching between the high and low logical levels are substantially diminished.

In a first embodiment, the present invention provides a driver comprising a pull up transistor for switching the output of the driver to a high-voltage, a pull down transistor for switching the output of the driver to a low voltage, a first current mirror transistor coupled to the pull up transistor for controlling the current transmitted to a load connected to the driver when the output is at the high-voltage, and a second current mirror transistor coupled to the pull down transistor for controlling the current transmitted to the load when the output is at the low voltage.

In a second embodiment, the present invention provides a driver comprising a pull up transistor for switching the output of the driver to a high voltage and a pull down transistor for switching the output of the driver to a low voltage. The driver further includes a first pre-driver comprising one or more switching transistors for switching the output of the first pre-driver between a high voltage and a low voltage and one or more additional transistors for controlling the current transmitted to the output of the first pre-driver. The output of the first pre-driver provides a gate signal for the pull up transistor having a controlled slew rate. In addition, the driver includes a second pre-driver comprising one or more switching transistors for switching the output of the second pre-driver between a high voltage and a low voltage and one or more additional transistors for controlling the current transmitted to the output of the second pre-driver. The output of the second pre-driver provides a gate signal for the pull down transistor having a controlled slew rate.

The present invention further provides a method of controlling a driver comprising switching the output of the driver to a high voltage using a pull up transistor, switching the output of the driver to a low voltage using a pull down transistor, controlling the current transmitted to a load connected to the driver when the output is at the high voltage using a first current mirror transistor coupled to the pull up transistor and controlling the current transmitted to the load when the output is at the low voltage using a second current mirror transistor coupled to the pull down transistor.

The present invention provides a further method for controlling a driver comprising switching the output of the driver to a high voltage using a pull up transistor and switching the output of the driver to a low voltage using a pull down transistor. The method also includes providing a gate signal for the pull up transistor having a controlled slew rate using a first pre-driver having one or more switching transistors for switching the output of the first pre-driver between a high voltage and a low voltage and one or more additional transistors for controlling the current transmitted to the output of the first pre-driver, and providing a gate signal for the pull down transistor having a controlled slew rate using a second pre-driver having one or more switching transistors for switching the output of the second pre-driver between a high voltage and a low voltage and one or more additional transistors for controlling the current transmitted by the output of the second pre-driver.

DESCRIPTION OF THE PREFERRED EMBODIMENTS

Figure 1:
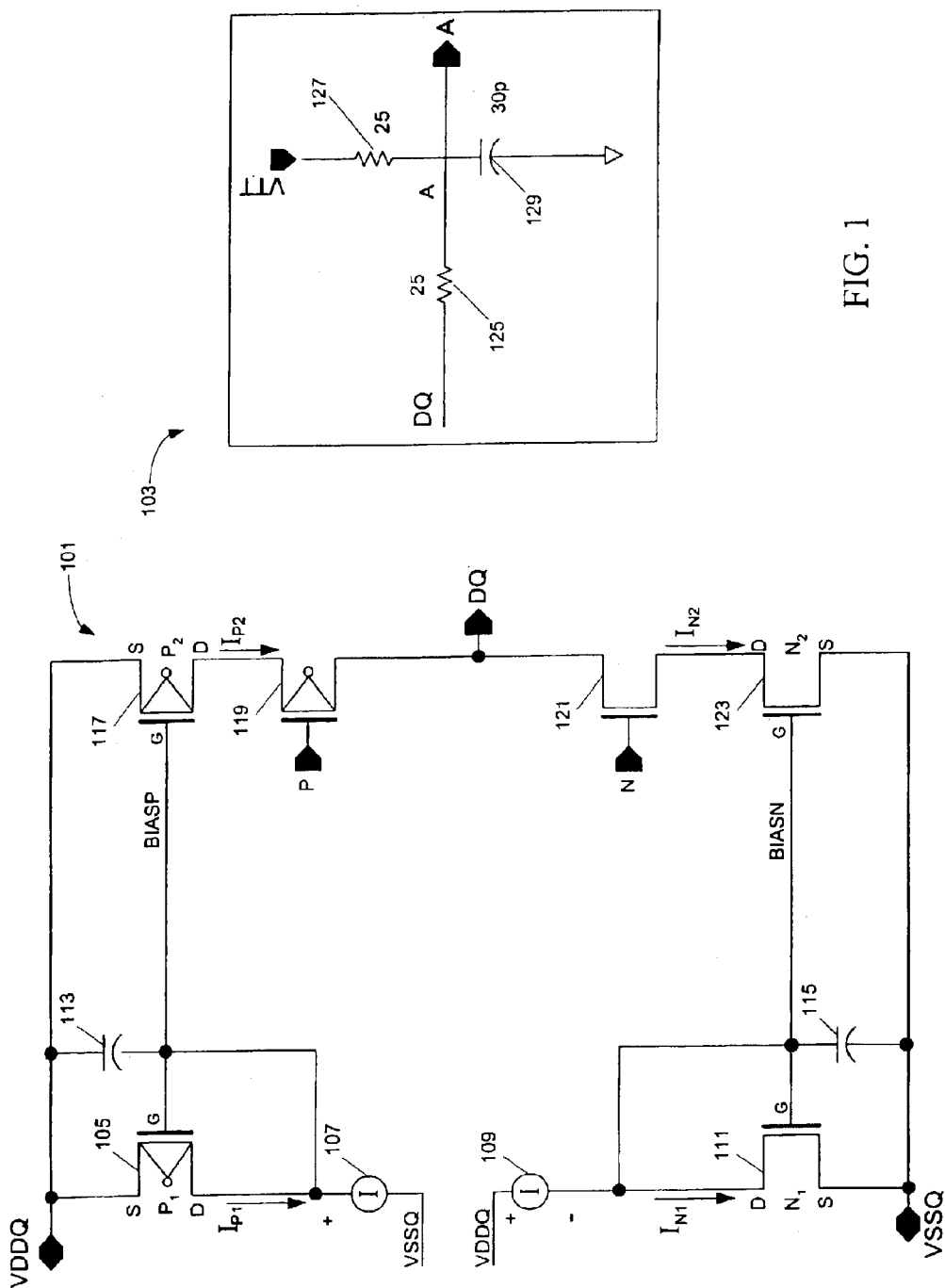
FIG. 1 is a schematic diagram of an off chip driver circuit employing current mirror transistors in accordance with an embodiment of the present invention.

An off chip driver 101 in accordance with the present invention is shown in FIG. 1. The output signal on terminal DQ of driver 101 drives off chip load 103. Load 103 is a Stub Series Terminated Logic ("SSTL2"), Class 2 load with a 25 ohm series resistor 125, a 25 ohm termination resistor 127 to VTT and a 30 picofarad capacitor 129 to ground.

Off chip driver 101 includes current sources 107 and 109, pull up transistor 119, pull down transistor 121 and current mirror transistors 105, 117, 111 and 123. These elements are connected as shown in FIG. 1. Pull up transistor 119 is a P-channel CMOS transistor, and pull down transistor 121 is an N-channel CMOS transistor. Current mirror transistors 105 and 117 are P-channel CMOS transistors (also labeled $P_1$ and $P_2$, respectively, in FIG. 1), and current mirror transistors 111 and 123 are N-channel CMOS transistors (also labeled $N_1$ and $N_2$, respectively, in FIG. 1). Capacitors 113 and 115 provide voltage stability between the gates and sources of the current mirror transistors.

As shown in FIG. 1, the sources of current mirror transistors 105 and 117 are connected, and the sources of current mirror transistors 111 and 123 are connected. Also, the gates of current mirror transistors 105 and 117 are connected to each other and to the drain of transistor 105. Similarly, the gates of current mirror transistors 111 and 123 are connected to each other and to the drain of transistor 111. As a result, if the widths of the gates (W) of current mirror transistors 105 and 117 are the same and the widths of the gates (W) of current mirror transistors 111 and 123 are the same, the current $I_{P2}$ in the drain of transistor 117 is the same as the current $I_{P1}$ in the drain of transistor 105, and the current $I_{N2}$ in the drain of transistor 123 is the same as the current $I_{N1}$ in the drain of transistor 111. However, if the widths of the gates of current mirror transistors 105 and 117 are different, then current $I_{P2}=(W_{P2}/W_{P1}) I_{P1}$, where $W_{P1}$ is the width of the gate of transistor 105 ($P_1$) and $W_{P2}$ is the width of the gate of transistor 117 ($P_2$) Similarly, if the widths of the gates of current mirror transistors 111 and 123 are different, then current $I_{N2}=(W_{N2}/W_{N1}) I_{N1}$, where $W_{N1}$ is the width of the gate of transistor 111 ($N_1$) and $W_{N2}$ is the width of the gate of transistor 123 ($N_2$).

Pull up transistor 119 and pull down transistor 121 are controlled by, respectively, the inputs to terminals P and N connected to the gates of these transistors. When the inputs on terminals P and N are low, pull up transistor 119 is turned on and pull down transistor 121 is turned off. As a result, the output on output terminal DQ is high, and the output current on this terminal is the current $I_{P2}$ controlled by current source 107 and current mirror transistors 117 and 105. On the other hand, when the inputs on terminals P and N are high, pull up transistor 119 is turned off and pull down transistor 121 is turned on. As a result, the output on output terminal DQ is low, and the output current on this terminal is the current $I_{N2}$ controlled by current source 109 and current mirror transistors 123 and 111.

With the mirror transistors, the output impedance of driver 101 can be modified to match the input impedance of any load. For example, if the minimum output voltage swing from VTT at node A of load 103 between the high and low voltage states is plus or minus 380 mV, the DC output current at terminal DQ should be 15.2 mA (380 mV/25 ohms). Therefore, if $W_{P2}=W_{P1}$ and $W_{N2}=W_{N1}$, by setting the current produced by current sources 107 and 109 to 15.2 mA, the output impedance of driver 101 will match the input impedance of load 103. On the other hand, if the currents produced by current sources 107 and 109 are fixed at a specified amount, for example 100 µA, then the desired output current of 15.2 mA can be achieved by adjusting the values of $W_{P2}/W_{P1}$ and $W_{N2}/W_{N1}$. For example, an output current of 15.2 mA is achieved when these current sources are set at 100 µA when the values of $W_{P2}/W_{P1}$ and $W_{N2}/W_{N1}$ equal 152 (15.2 mA/100 µA).

The gate widths $W_{P1}$, $W_{P2}$, $W_{N1}$ and $W_{N2}$ can be set at the time of fabrication of driver 101 such that $I_{P2}$ and $I_{N2}$ match the input impedance of a predetermined load. On the other hand, $I_{P2}$ and $I_{N2}$ can be made variable to match the input impedance of a variety of loads by selectively coupling transistors 117 and 123 to one of a plurality of current mirror transistors. Such an off chip driver circuit is shown in FIG. 2.

Figure 2:
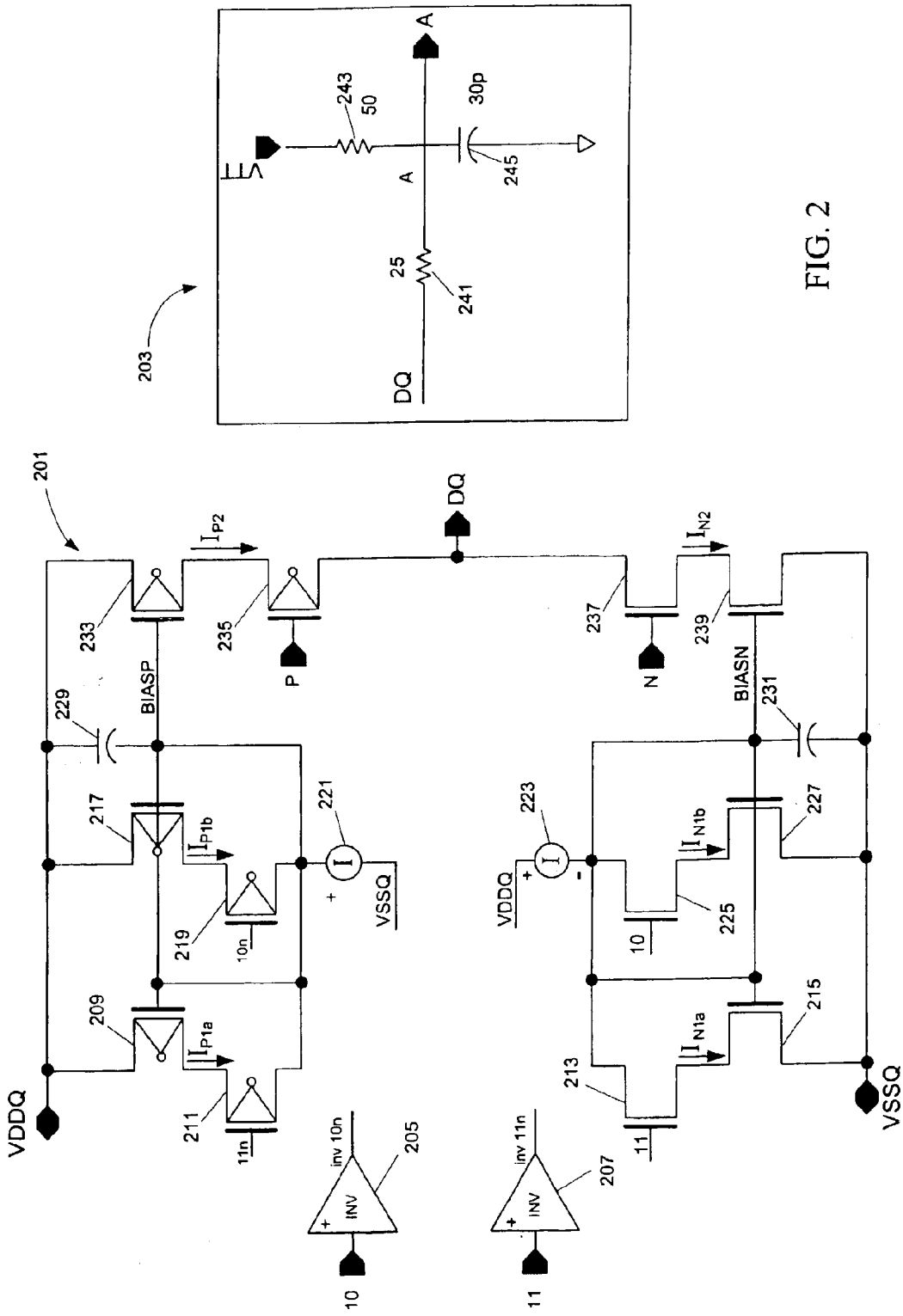
FIG. 2 is a schematic diagram of a modification of the embodiment of FIG. 1 with additional circuitry for modifying the current transmitted by the current mirror transistors.

The off chip driver circuit 201 of FIG. 2 includes current sources 221 and 223, pull up transistor 235, pull down transistor 237, current mirror transistors 209, 217, 233, 215, 227 and 239 and switching transistors 211, 219, 213 and 225. These elements are connected as shown in FIG. 2. As in the embodiment of FIG. 1, capacitors 229 and 231 provide voltage stability between the gates and sources of the current mirror transistors.

Switching transistors 211, 219, 213 and 225 are turned on and off by the signals transmitted on terminals 10 and 11, and these switching transistors in turn control the activation of, respectively, mirror transistors 209, 217, 215 and 227. The signals on terminals 10 and 11 are inverted by, respectively, inverters 205 and 207 to provide signals 10n and 11n. If the signal on terminals 10 is high and the signal on terminal 11 is low, P-channel switching transistor 219 receives a low input signal on its gate, and N-channel switching transistor 225 receives a high input signal on its gate. As a result, switching transistors 219 and 225 are turned on, and mirror transistors 217 and 227 are activated. However, with such signals on terminals 10 and 11, P-channel switching transistor 211 receives a high input signal on its gate, and N-channel switching transistor 213 receives a low input signal on its gate. As result, switching transistors 211 and 213 are turned off, and mirror transistors 209 and 215 are not activated. Therefore, the current $I_{P2}$ is controlled by mirror transistor 217 and the ratio of the widths the gates of mirror transistors 233 and 217, and the current $I_{N2}$ is controlled by mirror transistor 227 and the ratio of the widths of the gates of mirror transistors 239 and 227. If the widths of the gates of mirror transistors 233 and 217 are equal, and the widths of the gates of mirror transistors 239 and 227 are equal, then $I_{P2}=I_{P1b}$ and $I_{N2}=I_{N1b}$.

On the other hand, if the signal on terminals 10 is low and the signal on terminal 11 is high, P-channel switching transistor 211 receives a low input signal on its gate, and N-channel switching transistor 213 receives a high input signal on its gate. As a result, switching transistors 211 and 213 are turned on, and mirror transistors 209 and 215 are activated. However, with such signals on terminals 10 and 11, P-channel switching transistor 219 receives a high input signal on its gate, and N-channel switching transistor 225 receives a low input signal on it's gate. As result, switching transistors 219 and 225 are turned off, and mirror transistors 217 and 227 are not activated. Therefore, the current $I_{P2}$ is controlled by mirror transistor 209 and the ratio of the widths of the gates of mirror transistors 233 and 209, and the current $I_{N2}$ is controlled by mirror transistor 215 and the ratio of the widths of the gates of mirror transistors 239 and 215. If the widths of the gates of mirror transistors 233 and 209 are equal, and the widths of the gates of mirror transistors 239 and 215 are equal, then $I_{P2}=I_{P1a}$ and $I_{N2}=I_{N1a}$.

As shown in FIG. 2, off chip driver circuit 201 is driving load 203. Load 203 is an SSTL2, Class 1 load with a 25-ohm series resistor 241, a 50-ohm termination resistor 243 to VTT and a 30 picofarad capacitor 245 to ground. Assuming again a minimum output voltage swing from VTT at node A of load 203 between the high and low voltage states of plus or minus 380 mV, the DC output current at terminal DQ should be 7.6 mA (380 mV/50 ohms). Therefore, if the currents produced by current sources 221 and 223 are fixed at 100 $\mu$A, then the desired output current of 7.6 mA can be achieved by activating mirror transistors 209 and 215 and setting the values of $W_{P2}/W_{P1a}$ and $W_{N2}/W_{N1a}$ to 76 (7.6 mA/100 $\mu$A), where $W_{P2}$ is the width of the gate of mirror transistor 233, $W_{P1a}$ is the width of the gate of mirror transistor 209, $W_{N2}$ is the width of the gate of mirror transistor 239 and $W_{N1a}$ is the width of the gate of mirror transistor 215. On the other hand, if off chip driver circuit 201 drives load 123 shown in FIG. 1, an SSTL2, Class 2 load requiring a DC output current at terminal DQ of 15.2 mA, this desired output current can be achieved by activating mirror transistors 217 and 227 and setting the values of $W_{P2}/W_{P1b}$ and $W_{N2}/W_{N1b}$ to 152 (15.2 mA/100 $\mu$A), where $W_{P1b}$ is the width of the gate of mirror transistor 217 and $W_{N1b}$ is the width of the gate of mirror transistor 227.

Although the embodiment of FIG. 2 operates at only two selectable output impedances, additional selectable output impedances can be provided by adding further switching transistor/mirror transistor combinations having different ratios of gate widths. Selection of the appropriate mirror transistor/switching transistor pair could be effected using a binary input that is selected using fuses, a mode register, masking or similar means.

Figure 3:
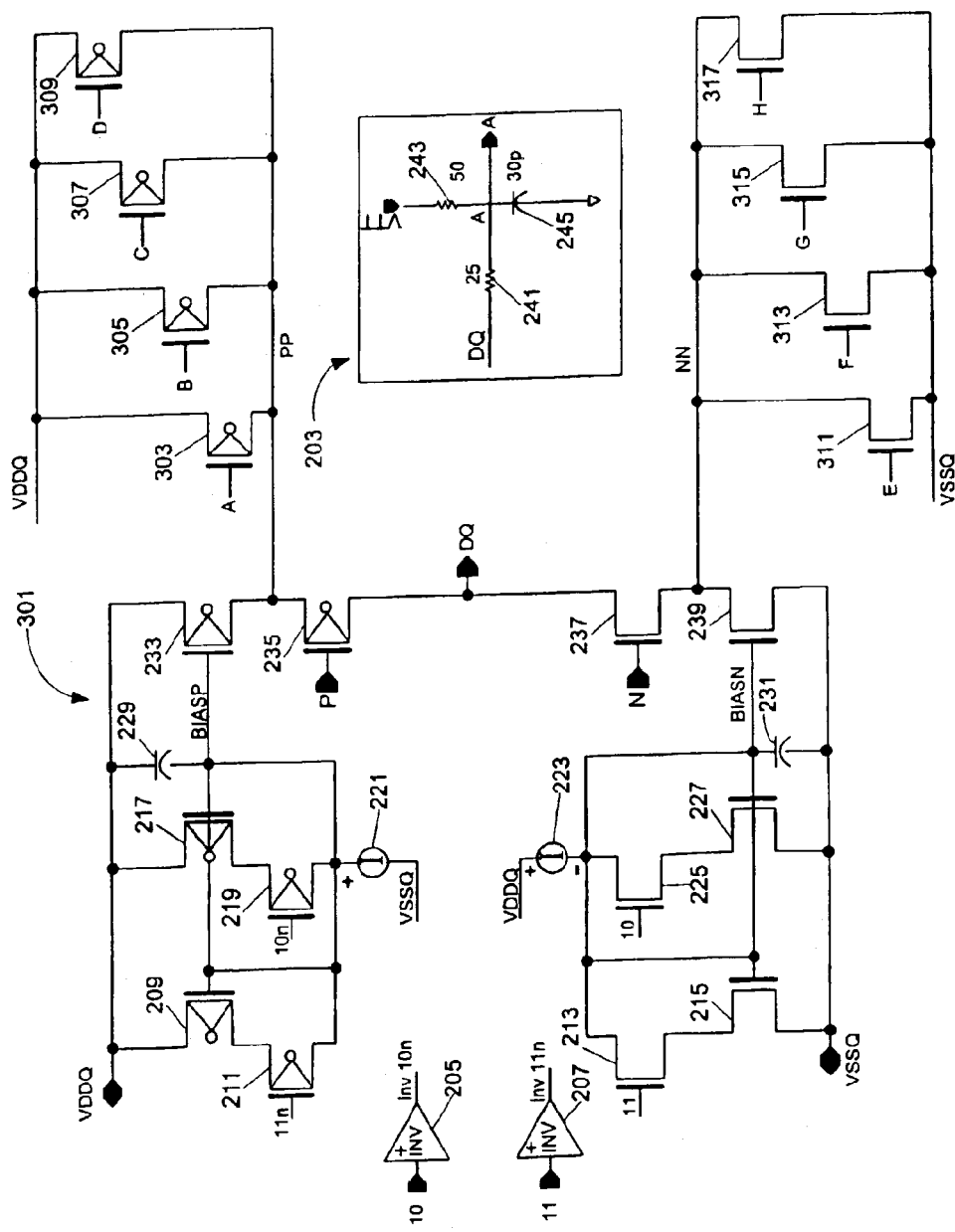
FIG. 3 is a schematic diagram of a modification of the embodiment of FIG. 2 with further circuitry for modifying the final drive current of the off chip driver circuit.

Off chip driver 301 shown in FIG. 3 is a modification of the embodiment of FIG. 2 with further circuitry for modifying the output drive current of the off chip driver circuit to compensate for manufacturing tolerances, temperature variances and other causes of current fluctuations and to otherwise fine tune the output drive current. Off chip driver 301 is identical to the embodiment of FIG. 2 except for P-channel transistors 303, 305, 307 and 309 and N-channel transistors 311, 313, 315 and 317. The sources of transistors 303, 305, 307 and 309 are connected to each other and to the source of mirror transistor 233, and the drains of transistors 303, 305, 307 and 309 are connected to each other and to the drain of mirror transistor 233. Similarly, the sources of transistors 311, 313, 315 and 317 are connected to each other and to the source of mirror transistor 239, and the drains of transistors 311, 313, 315 and 317 are connected to each other and to the drain of mirror transistor 239. Transistors 303, 305, 307, 309, 311, 313, 315 and 317 are selectively activated in response to the signals A, B, C, D, E, F, G, H transmitted to their respective gates. These signals are generated in response to binary control logic. By activating one or more of transistors 303, 305, 307, 309, 311, 313, 315 and 317, the output drive current transmitted on terminal DQ is incrementally increased in stages.

Figure 4:
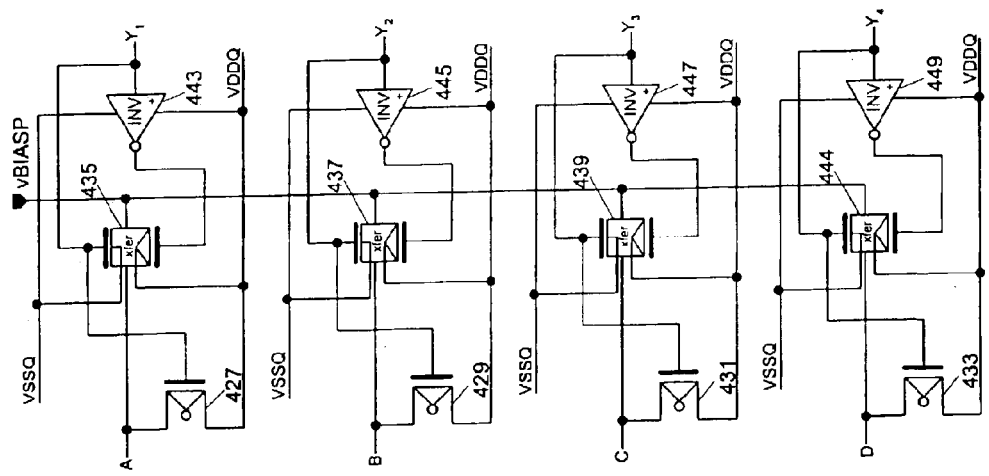
FIG. 4 is a schematic diagram of a control circuit for controlling the circuitry in the embodiment of FIG. 3 for modifying the final drive current.
Figure 4:
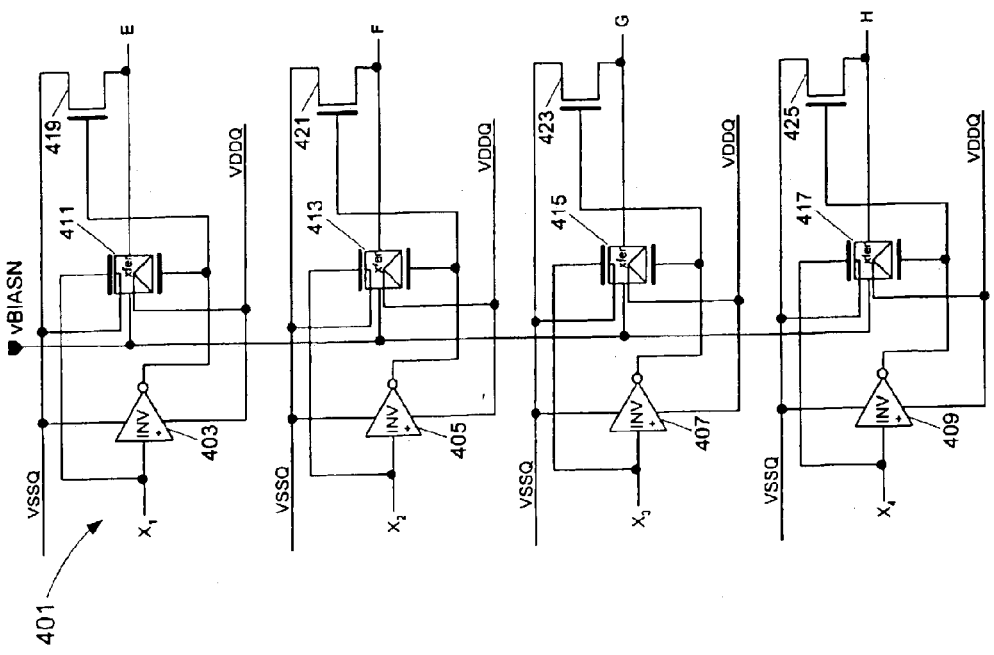

The control system 401 for selectively generating signals A, B, C, D, E, F, G, H in response to a binary input is shown in FIG. 4. Control system 401 selectively transmits the bias voltage vBIASP to gate terminals A, B, C, and D of transistors 303, 305, 307 and 309, respectively, in response to the binary signals appearing on terminals $Y_1$, $Y_2$, $Y_3$ and $Y_4$, respectively, and selectively transmits the bias voltage vBIASN to gate terminals E, F, G and H of transistors 311, 313, 315 and 317, respectively, in response to the binary signals appearing on terminals $X_1$, $X_2$, $X_3$ and $X_4$, respectively. Binary signals on terminals $Y_1$, $Y_2$, $Y_3$ and $Y_4$ are directly transmitted to the N-channel transistor of transfer gates 435, 437, 439 and 444, respectively, and binary signals on terminals $X_1$, $X_2$, $X_3$ and $X_4$ are directly transmitted to the N-channel transistor of transfer gates 411, 413, 415 and 417, respectively. Binary signals on terminals $Y_1$, $Y_2$, $Y_3$ and $Y_4$ also are transmitted through inverters 443, 445, 447 and 449 to the P-channel transistor of transfer gates 435, 437, 439 and 444, respectively, and binary signals on terminals $X_1$, $X_2$, $X_3$ and $X_4$ also are transmitted through inverters 403, 405, 407 and 409 to the P-channel transistor of transfer gates 411, 413, 415 and 417, respectively. The inputs of transfer gates 435, 437, 439 and 444 are connected to vBIASP, and the outputs of these transfer gates are connected to, respectively, gate terminals A, B, C, and D. The inputs of transfer gates 411, 413, 415 and 417 are connected to vBIASN, and the outputs of these transfer gates are connected to, respectively, gate terminals E, F, G and H. Gate terminals A, B, C, and D also are connected to the sources of P-channel transistors 427, 429, 431 and 433, respectively, and gate terminals E, F, G and H also are connected to the sources of N-channel transistors 419, 421, 423 and 425, respectively. The drains of transistors 427, 429, 431 and 433 are connected to VDDQ, and the drains of transistors 419, 421, 423 and 425 are connected to VSSQ. Transistors 427, 429, 431 and 433 clamp gate terminals A, B, C, and D, respectively, to VDDQ, when transfer gates 435, 437, 439 and 444, respectively, are in the off state and no bias voltage is transmitted to their outputs, and release these gate terminals to be controlled by the outputs of the transfer gates when the transfer gates are transmitting vBIASP in the on state. In a similar manner, transistors 419, 421, 423 and 425 clamp gate terminals E, F, G and H, respectively, to VSSQ, when transfer gates 411, 413, 415 and 417, respectively, are in the off state and no bias voltage is transmitted to their outputs, and release these gate terminals to be controlled by the outputs of the transfer gates when the transfer gates are transmitting vBIASN in the on state.

Figure 5:
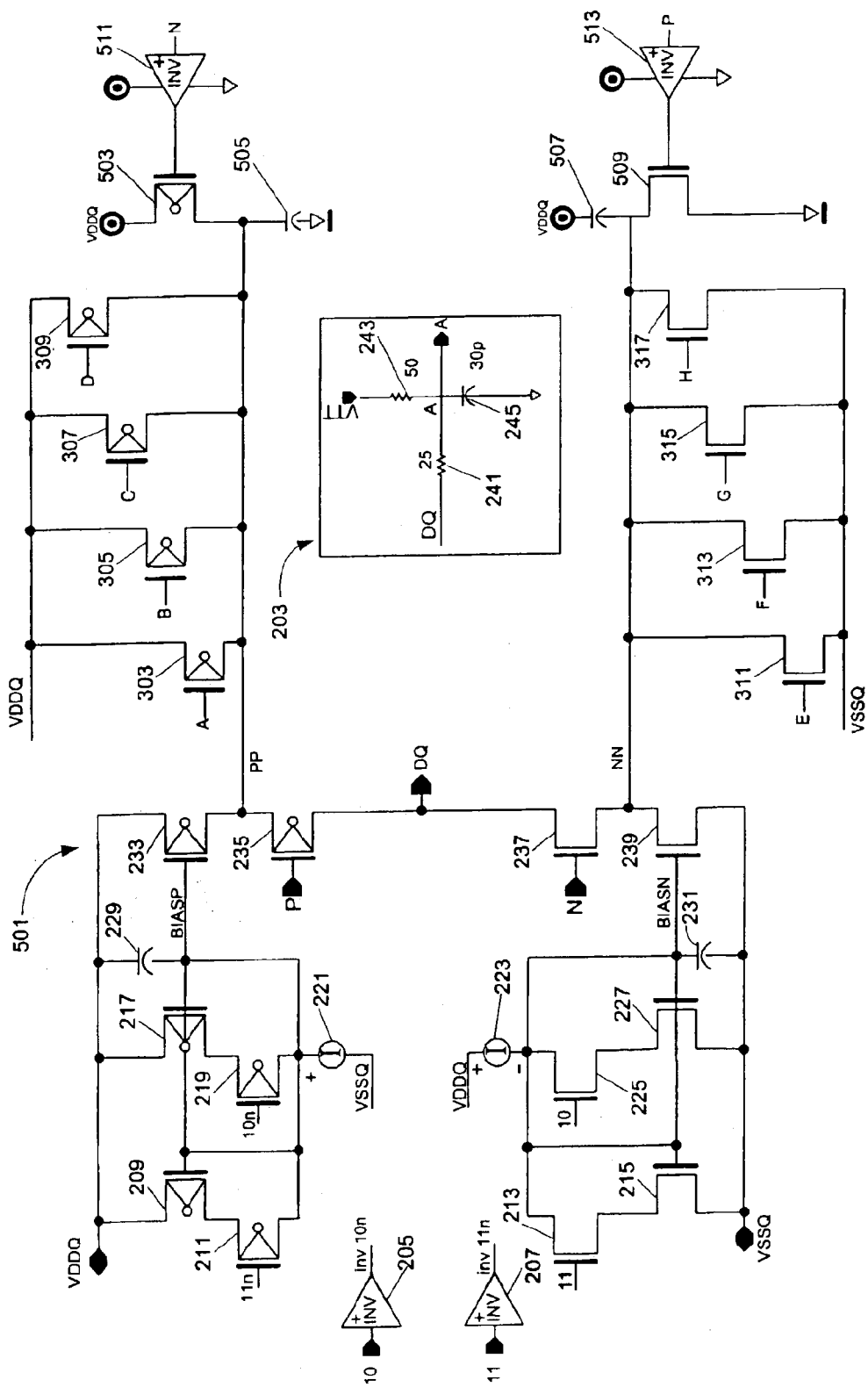
FIG. 5 is a schematic diagram of a modification of the embodiment of FIG. 3 with additional circuitry for increasing the speed of switching of the driver's output signal.

Off chip driver 501 shown in FIG. 5 is a modification of the embodiment of FIG. 3 with additional circuitry for increasing the speed of switching of the driver's output signal and for diminishing the amount of noise on this signal during switching. Off chip driver 501 is identical to the embodiment of FIG. 3 except for P-channel transistor 503, N-channel transistor 509, capacitors 505 and 507 and inverters 511 and 513. The value of capacitors 505 and 507 is variable and is set generally to the value of the capacitance of the external load, namely, approximately 30 picofarads.

Capacitor 505 is charged by mirror transistor 233 during the periods that pull up transistor 235 is turned off, and capacitor 507 is charged by mirror transistor 239 during the periods that pull down transistor 237 is turned off. Therefore, when pull up transistor 235 is turned off, node PP is brought to a high voltage and is decoupled from VSSQ, and when pull down transistor 237 is turned off, node NN is brought to a low voltage and is decoupled from VDDQ. When pull up transistor 235 is turned on, the high voltage on node PP causes the voltage on output terminal DQ to switch rapidly to the high voltage state, and capacitor 505 discharges to provide current to the external load. Similarly, when pull down transistor 237 is turned on, the low voltage on node NN causes the voltage on output terminal DQ to switch rapidly to the low voltage state, and capacitor 507 discharges to provide current to the external load. As a result, quick switching between the high and low voltage states is facilitated, and noise resulting from parasitics and other sources is diminished.

If the signals on terminals P and Q of pull up transistor 235 and pull down transistor 237, respectively, caused these transistors to switch rapidly between the high and low voltage states, the current from mirror transistors 233 and 239 during the inactive states may not be sufficient to fully charge capacitors 505 and 507, respectively. Because of this possibility, transistors 503 and 509 are provided to provide additional current for charging capacitors 505 and 507, respectively, during the inactive states of pull up transistor 235 and pull down transistor 237, respectively. When the signals on terminals N and P are high to turn on pull down transistor 237 and turn off pull up transistor 235, the output signal from inverter 511 is low to turn on transistor 503. As a result, current is provided to capacitor 505 to charge this capacitor during the inactive state of pull up transistor 235. Similarly, when the signals on terminal P and N are low to turn on pull up transistor 235 and turn off pull down transistor 237, the output signal from inverter 513 is high to turn on transistor 509 to charge capacitor 507 during the inactive state of pull down transistor 237.

Figure 6:
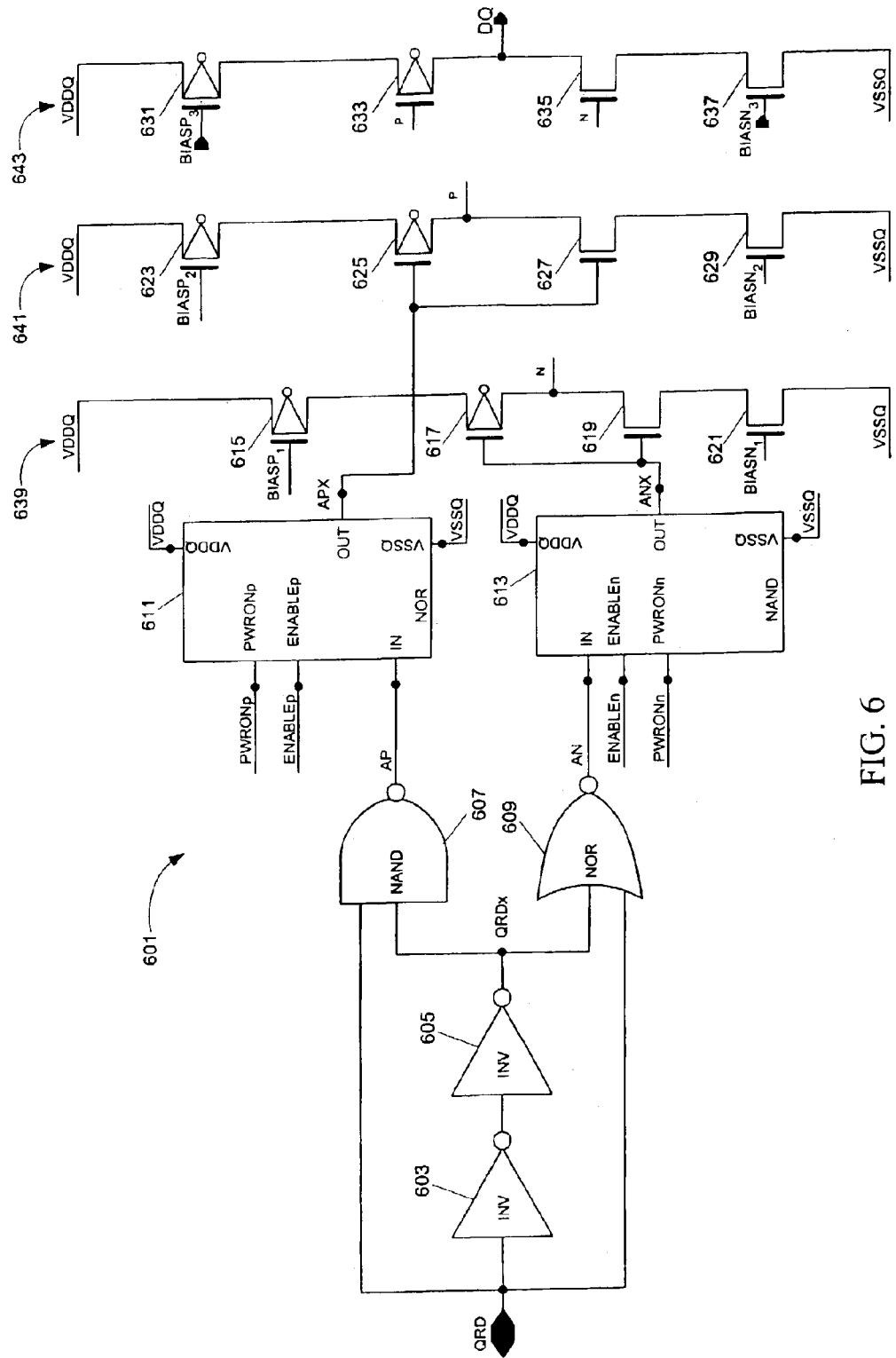
FIG. 6 is a schematic diagram of an off chip driver circuit having gate signals with a controlled slew rate for reducing noise and ringing during switching of the pull up and pull down transistors of the off chip driver.

FIG. 6 is a schematic diagram of an off chip driver circuit 601 having gate signals with a controlled slew rate (controlled rate of change of output voltage) for reducing noise and ringing during switching of the pull up and pull down transistors of the off chip driver. Driver circuit 601 includes a first stage comprising inverters 603 and 605, nand-gate type level-shifter 607 and nor-gate type level-shifter 609. Inverters 603 and 605 provide a two-gate delay for an input signal QRD to provide delayed input signal QRDx. Input signal QRD and delayed input signal QRDx are transmitted to both nand-gate type level-shifter 607 and nor-gate type level-shifter 609 whose outputs are signals AP and AN, respectively. A second stage of driver circuit 601 comprises nor gate 611 and nand gate 613 that receive signals AP and AN, respectively, and produce output signals APX and ANX, respectively. Nor gate 611 also receives a power on signal (PWRONp) and an enable signal (ENABLEp), and nand gate 613 also receives a power on signal (PWRONn) and an enable signal (ENABLEn). Nor gate 611 and nand gate 613 shift the voltage level of output signals AP and AN in relation to that of input signals QRD and QRDx.

Driver circuit 601 further includes a third stage comprising pre-drivers 639 and 641 whose outputs provide the gate signals for output driver 643. Pre-driver 639 comprises P-channel transistors 615 and 617 and N-channel transistors 619 and 621, and pre-driver 641 comprises P-channel transistors 623 and 625 and N-channel transistors 627 and 629. Pre-driver 639 provides the gate signal N for N-channel pull down transistor 635 of output driver 643, and pre-driver 641 provides the gate signal P for P-channel pull up transistor 633 of output driver 643. P-channel transistors 617 and 625 act as pull up transistors for the gate signals produced by, respectively, pre-drivers 639 and 641, and N-channel transistors 619 and 627 act as pull down transistors for the gate signals produced by, respectively, pre-drivers 639 and 641. Output signal APX from nor gate 611 provides the gate signals for P-channel pull up transistor 625 and N-channel pull down transistor 627 of pre-driver 641, and output signal ANX from nand gate 613 provides the gate signals for P-channel pull up transistor 617 and N-channel pull down transistor 619 of pre-driver 639. P-channel transistors 615 and 623 provide current control for pre-drivers 639 and 641, respectively, when P-channel pull up transistors 617 and 625, respectively, are active, and N-channel transistors 621 and 629 provide current control for pre-drivers 639 and 641, respectively, when N-channel pull down transistors 619 and 627, respectively, are active. P-channel transistor 631 provides current control for output driver 643 when P-channel pull up transistor 633 is active, and N-channel transistor 637 provides current control for output driver 643 when N-channel pull down transistor 635 is active. Transistors 631 and 637 of output driver 643 may be current mirror transistors such as those shown in the embodiments of FIGS. 1, 2, 3 and 5. Transistors 615 and 621 of pre-driver 639 and transistors 623 and 629 of pre-driver 641 also may be current mirror transistors such as those shown in these embodiments. Signals BIASP1, BIASP2, BIASP3, BIASN1, BIASN2 and BIASN3 provide gate signals for transistors 615, 623, 631, 621, 629 and 637, respectively. The value of these gate signals may be the same or separately adjusted.

When input signal QRD goes high, signals AP and AN go low. In the power on and enabled states, signals PWRONp and ENABLEp are low and signals ENABLEn and PWRONn are high. As a result, gate signals APX and ANX go high causing pull down transistor 619 of pre-driver 639 to turn on, pull up transistors 617 of pre-driver 639 to turn off, pull down transistor 627 of pre-driver 641 to turn on and pull up transistor 625 of pre-driver 641 to turn off. Therefore, gate signals N and P go low causing pull up transistor 633 of output driver 643 to turn on and pull down transistor 635 of output driver 643 to turn off. As a result, output signal DQ goes high, and the current of this signal is controlled by current control transistor 631. Also, in this state, the current of gate signal N of pre-driver 639 is controlled by current control transistor 621, and the current of gate signal P of pre-driver 641 is controlled by current control transistor 629.

When input signal QRD goes low, signals AP and AN go high. As a result, gate signals APX and ANX go low causing pull down transistor 619 of pre-driver 639 to turn off, pull up transistors 617 of pre-driver 639 to turn on, pull down transistor 627 of pre-driver 641 to turn off and pull up transistor 625 of pre-driver 641 to turn on. Therefore, gate signals N and P go high causing pull up transistor 633 of output driver 643 to turn off and pull down transistor 635 of output driver 643 to turn on. As a result, output signal DQ goes low, and the current of this signal is controlled by current control transistor 637. Also, in this state, the current of gate signal N of pre-driver 639 is controlled by current control transistor 615, and the current of gate signal P of pre-driver 641 is controlled by current control transistor 623.

The slew rate of gate signal N is controlled by pre-driver 639, and the slew rate of gate signal P is controlled by pre-driver 639. As a result, pull up transistor 633 and pull down transistor 635 of output driver 643 are activated and deactivated in a controlled manner. Since the loads at nodes N and P of transistors 633 and 635, respectively, are mainly capacitive and the current of gate signals N and P of pre-drivers 639 and 641, respectively, are relatively constant values that are controlled, the slew rates at nodes N and P of transistors 633 and 635 also are relatively constant values that are controlled. The values of the transistors comprising the pre-drivers, and the input signals to the pre-drivers, are selected to provide a predetermined slew rate, for example, completion of 20 percent to 80 percent of a rise in voltage or a fall in voltage in 80 picoseconds. Also, since a direct relationship exists between the slew rates at nodes N and P and the slew rate of output signal DQ, the values of these transistors and the input signals to the pre-drivers also can be selected to provide a predetermined slew rate for output signal DQ. This controlled switching results in reduced noise on the output signal DQ and reduced ringing on the power buses for VDDQ and VSSQ.

Figure 7:
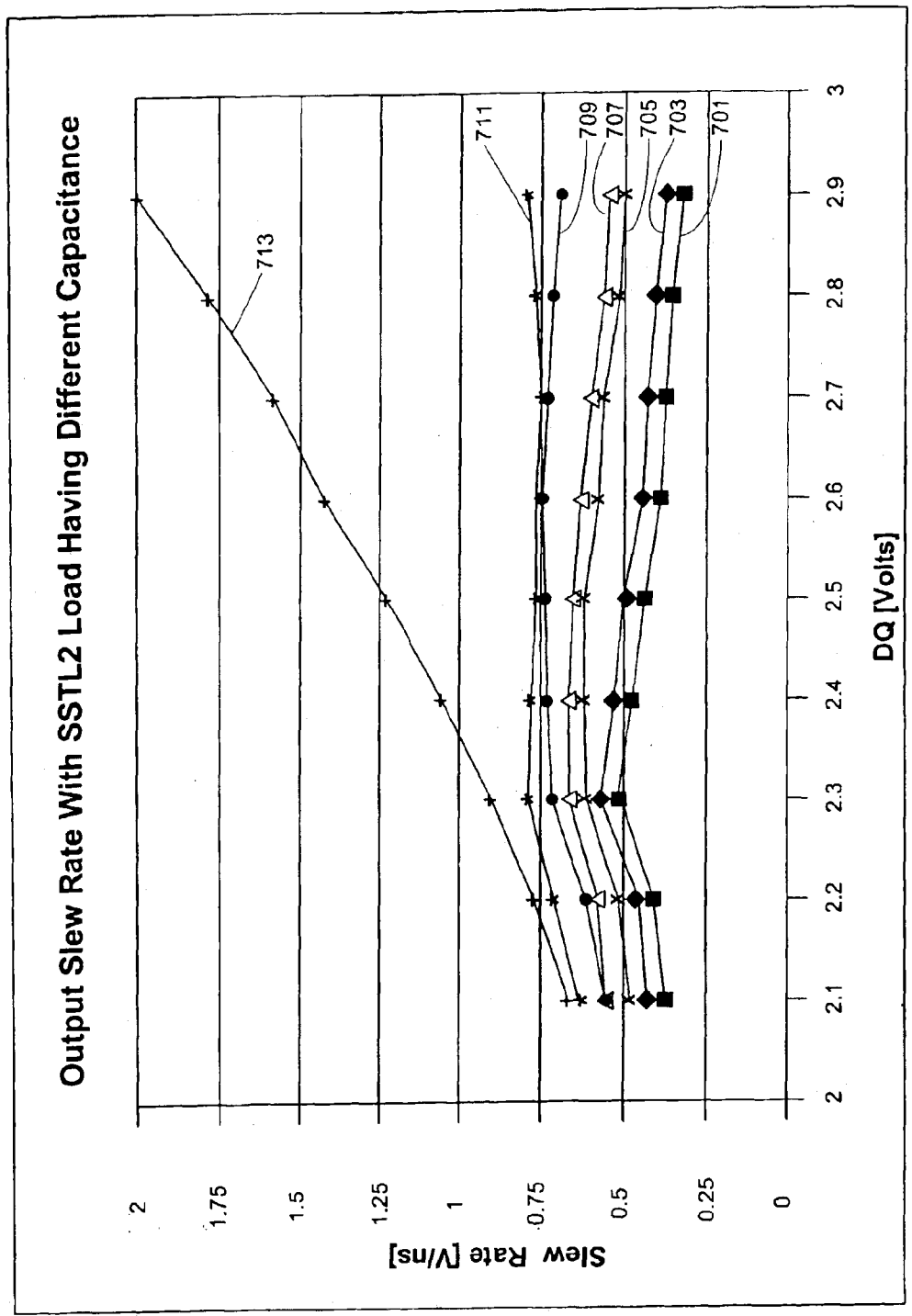
FIG. 7 is a graph of the slew rate of the output of the off chip driver circuit of FIG. 6 with different loads as a function of output voltage.

FIG. 7 is a graph of the slew rate of the output voltage DQ of the off chip driver circuit of FIG. 6 with different capacitive SSTL2 loads as a function of the output voltage. Plots 703, 707 and 711 depict the slew rate for a rising voltage with the SSTL2 load having a capacitance of 30 picofarads, 20 picofarads and 10 picofarads, respectively, and plots 701, 705 and 709 depict the slew rate for a falling voltage with the SSTL2 load having a capacitance of 30 picofarads, 20 picofarads and 10 picofarads, respectively. Plot 713 depicts the slew rate of the output voltage of an off chip driver circuit with no control of slew rate and driving an SSTL2 load having no capacitance. As can be seen from this graph, the off chip driver circuit of FIG. 6 provides an output voltage having a relatively constant slew rate over a range of capacitive loads and output voltages. The control of the slew rate begins at approximately 2.3 volts. As can be seen from plot 713, the slew rate of the output voltage for an off chip driver circuit without control of slew rate varies substantially as a function of output voltage.

Figure 8:
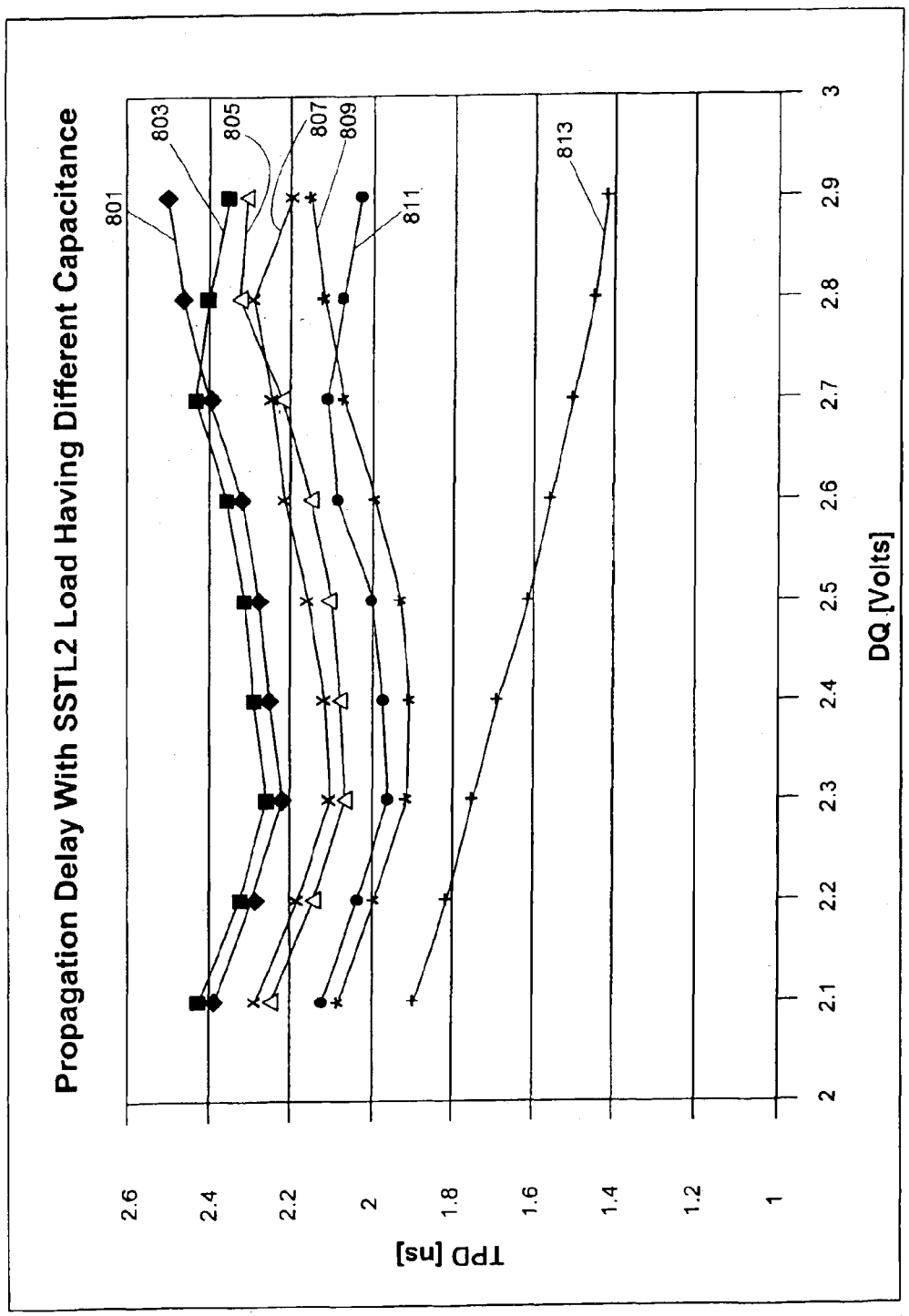
FIG. 8 is a graph of the total propagation delay of the off chip driver circuit of FIG. 6 with different loads as a function of output voltage.

FIG. 8 is a graph of the total propagation delay (TPD) of the off chip driver circuit of FIG. 6 with different capacitive SSTL2 loads as a function of output voltage DQ. Plots 801, 805 and 809 depict the total propagation delay of the off chip driver circuit for a rising voltage with the SSTL2 load having a capacitance of 30 picofarads, 20 picofarads and 10 picofarads, respectively, and plots 803, 807 and 811 depict the total propagation delay of the off chip driver circuit for a falling voltage with the SSTL2 load having a capacitance of 30 picofarads, 20 picofarads and 10 picofarads, respectively. Plot 813 depicts the total propagation delay of an off chip driver circuit with no control of slew rate and driving an SSTL2 load having no capacitance. As can be seen from this graph, the off chip driver circuit of FIG. 6 has a total propagation delay that is relatively constant over a range of capacitive loads and output voltages. As can be seen from plot 813, the total propagation delay for an off chip driver circuit without control of slew rate varies substantially as a function of output voltage.

Although particular embodiments of the present invention have been shown and described, many varied embodiments incorporating the teachings of the present invention easily may be constructed by those skilled in the art. For example, the circuits described above may be used in drivers generally, not only off chip drivers. Also, these circuits are particularly appropriate for charging and discharging large loads generally and to any environment where low noise is required. The circuits may be used, for example, in sense amplifier circuits used in commodity DRAMs. Also, these circuits may be constructed using technology other than MOS or CMOS, for example, using junction field effect transistors (JFETs) or bipolar transistors.

What is claimed is:

1. A driver, comprising:
   a pull up transistor for switching the output of said driver to a high voltage;
   a pull down transistor for switching the output of said driver to a low voltage;
   a first current mirror transistor coupled to said pull up transistor for controlling the current transmitted to a load connected to said driver when said output is at the high voltage;
   a second current mirror transistor coupled to said pull down transistor for controlling the current transmitted to said load when said output is at the low voltage;
   a plurality of third current mirror transistors coupled to said first current mirror transistor, said third current mirror transistors controlling the current transmitted by said first current mirror transistor and each of said third current mirror transistors being coupled to a switching transistor for activating and deactivating said third current mirror transistor; and
   a plurality of fourth current mirror transistors coupled to said second current mirror transistor, said fourth current mirror transistors controlling the current transmitted by said second current mirror transistor and each of said fourth current mirror transistors being coupled to a switching transistor for activating and deactivating said fourth current mirror transistor.

2. A driver as in claim 1, wherein said first current mirror transistor is a P-channel transistor having a drain connected to the source of said pull up transistor and said second current mirror transistor is an N-channel transistor having a drain connected to the source of said pull down transistor.

3. A driver as in claim 1, wherein said driver is fabricated on an integrated circuit chip and is adapted to drive a load located off of said chip.

4. A driver, comprising:
   a pull up transistor for switching the output of said driver to a high voltage;
   a pull down transistor for switching the output of said driver to a low voltage;
   a first current mirror transistor coupled to said pull up transistor for controlling the current transmitted to a load connected to said driver when said output is at the high voltage;

a second current mirror transistor coupled to said pull down transistor for controlling the current transmitted to said load when said output is at the low voltage;

a plurality of first additional transistors, each of said first additional transistors being coupled to said first current mirror transistor for increasing the current transmitted by said first current mirror transistor when the output of said driver is at the high voltage; and a plurality of second additional transistors, each of said second additional transistors being coupled to said second current mirror transistor for increasing the current transmitted by said second current mirror transistor when the output of said driver is at the low voltage.

5. A driver as in claim 4, further comprising a circuit for receiving a binary input signal and transmitting output signals for selectively activating said first additional transistors and said second additional transistors.

6. A driver, comprising:

a pull up transistor for switching the output of said driver to a high voltage;

a pull down transistor for switching the output of said driver to a low voltage;

a first current mirror transistor coupled to said pull up transistor for controlling the current transmitted to a load connected to said driver when said output is at the high voltage;

a second current mirror transistor coupled to said pull down transistor for controlling the current transmitted to said load when said output is at the low voltage;

a first capacitor coupled to said first current mirror transistor, said first capacitor being charged by said first current mirror transistor when the output of said driver is at the low voltage and being discharged into said load when said output is at the high voltage; and a second capacitor coupled to said second current mirror transistor, said second capacitor being charged by said second current mirror transistor when the output of said driver is at the high voltage and being discharged into said load when said output is at the low voltage.

7. A driver as in claim 6, further comprising:

a transistor coupled to said first capacitor for increasing the charging of said first capacitor when the output of said driver is at the low voltage; and a transistor coupled to said second capacitor for increasing the charging of said second capacitor when the output of said driver is at the high voltage.

8. A driver, comprising:

a pull up transistor for switching the output of said driver to a high voltage;

a pull down transistor for switching the output of said driver to a low voltage;

a first current mirror transistor coupled to said pull up transistor for controlling the current transmitted to a load connected to said driver when said output is at the high voltage;

a second current mirror transistor coupled to said pull down transistor for controlling the current transmitted to said load when said output is at the low voltage;

a first pre-driver, said first pre-driver comprising one or more switching transistors for switching the output of said first pre-driver between a high voltage and a low voltage and one or more additional transistors for controlling the current transmitted to the output of said first pre-driver, said output of said first pre-driver providing a gate signal for said pull up transistor having a controlled slew rate; and a second pre-driver, said second pre-driver comprising one or more switching transistors for switching the output of said second pre-driver between a high voltage and a low voltage and one or more additional transistors for controlling the current transmitted by the output of said second pre-driver, said output of said second pre-driver providing a gate signal for said pull down transistor having a controlled slew rate.

9. A driver, comprising:

a pull up transistor for switching the output of said driver to a high voltage;

a pull down transistor for switching the output of said driver to a low voltage;

a first current mirror transistor coupled to said pull up transistor for controlling the current transmitted to a load connected to said driver when said output is at the high voltage;

a second current mirror transistor coupled to said pull down transistor for controlling the current transmitted to said load when said output is at the low voltage; and a third current mirror transistor having a gate connected to the gate of said first current mirror transistor, a source connected to the source of said first current mirror transistor and a drain connected to the gates of said first and third mirror transistors, said third current mirror transistor controlling the current transmitted by said first current mirror transistor.

10. A driver as in claim 9, further comprising a fourth current mirror transistor having a gate connected to the gate of said second current mirror transistor, a source connected to the source of said second current mirror transistor and a drain connected to the gates of said second and fourth current mirror transistors, said fourth current mirror transistor controlling the current transmitted by said second current mirror transistor.

11. A driver as in claim 9, wherein said third current mirror transistor is a P-channel CMOS transistor.

12. A driver as in claim 10, wherein said fourth current mirror transistor is an N-channel CMOS transistor.

13. A method of controlling a driver, comprising:

switching the output of said driver to a high voltage using a pull up transistor;

switching the output of said driver to a low voltage using a pull down transistor;

controlling the current transmitted to a load connected to said driver when said output is at the high voltage using a first current mirror transistor coupled to said pull up transistor;

controlling the current transmitted to said load when said output is at the low voltage using a second current mirror transistor coupled to said pull down transistor;

controlling the current transmitted by said first current mirror transistor by activating a selected one of a plurality of third current mirror transistors coupled to said first current mirror transistor and activating and deactivating each of said third current mirror transistors using a switching transistor coupled to said third current mirror transistor; and controlling the current transmitted by said second current mirror transistor by activating a selected one of a plurality of fourth current mirror transistors coupled to said second current mirror transistor and activating and deactivating each of said fourth current mirror transistors using a switching transistor coupled to said fourth current mirror transistor.

14. A method of controlling a driver, comprising:

switching the output of said driver to a high voltage using a pull up transistor;

switching the output of said driver to a low voltage using a pull down transistor;

controlling tho current transmitted to a load connected to said driver when said output is at the high voltage using a first current mirror transistor coupled to said pull up transistor;

controlling the current transmitted to said load when said output is at the low voltage using a second current mirror transistor coupled to said pull down transistor;

increasing the current transmitted by said first current mirror transistor when the output of said driver is at the high voltage using a plurality of first additional transistors coupled to said first current mirror transistor; and increasing the current transmitted by said second current mirror transistor when the output of said driver is at the low voltage using a plurality of second additional transistors coupled to said second current mirror transistor.

15. A method as in claim 14, further comprising selectively activating said first additional transistors and said second additional transistors by transmitting a binary input signal to a circuit that transmits in response corresponding gate signals to said first additional transistors and second additional transistors.

16. A method of controlling a driver, comprising:

switching the output of said driver to a high voltage using a pull up transistor;

switching the output of said driver to a low voltage using a pull down transistor;

controlling the current transmitted to a load connected to said driver when said output is at the high voltage using a first current mirror transistor coupled to said pull up transistor;

controlling the current transmitted to said load when said output is at the low voltage using a second current mirror transistor coupled to said pull down transistor;

charging a first capacitor coupled to said first current mirror transistor using said first current mirror transistor when the output of said driver is at the low voltage and discharging said first capacitor into said load when said output is at the high voltage; and charging a second capacitor coupled to said second current mirror transistor using said second current mirror transistor when the output of said driver is at the high voltage and discharging said second capacitor into said load when said output is at the low voltage.

17. A method as in claim 16, further comprising:

increasing the charging of said first capacitor when the output of said driver is at the low voltage using a transistor coupled to said first capacitor; and increasing the charging of said second capacitor when the output of said driver is at the high voltage using a transistor coupled to said second capacitor.

18. A method of controlling a driver, comprising:

switching the output of said driver to a high voltage using a pull up transistor;

switching the output of said driver to a low voltage using a pull down transistor;

controlling the current transmitted to a load connected to said driver when said output is at the high voltage using a first current mirror transistor coupled to said pull up transistor;

controlling the current transmitted to said load when said output is at the low voltage using a second current mirror transistor coupled to said pull down transistor;

providing a gate signal for said pull up transistor having a controlled slew rate using a first pre-driver having one or more switching transistors for switching the output of said first pre-driver between a high voltage and a low voltage and one or more additional transistors for controlling the current transmitted to the output of said first pre-driver; and providing a gate signal for said pull down transistor having a controlled slew rate using a second pre-driver having one or more switching transistors for switching the output of said second pre-driver between a high voltage and a low voltage and one or more additional transistors for controlling the current transmitted by the output of said second pre-driver.

19. A method of controlling a driver, comprising:

switching the output of said driver to a high voltage using a pull up transistor;

switching the output of said driver to a low voltage using a pull down transistor;

controlling the current transmitted to a load connected to said driver when said output is at the high voltage using a first current mirror transistor coupled to said pull up transistor;

controlling the current transmitted to said load when said output is at the low voltage using a second current mirror transistor coupled to said pull down transistor; and controlling the current transmitted by said first current mirror transistor using a third current mirror transistor having a gate connected to the gate of said first current mirror transistor, a source connected to the source of said first current mirror transistor and a drain connected to the gates of said first and third mirror transistors.

20. A method as in claim 19, further comprising controlling the current transmitted by said second current mirror transistor using a fourth current mirror transistor having a gate connected to the gate of said second current mirror transistor, a source connected to the source of said second current mirror transistor and a drain connected to the gates of said second and fourth current mirror transistors.

21. A method as in claim 19, wherein said third current mirror transistor is a P-channel CMOS transistor.

22. A method as in claim 20, wherein said fourth current mirror transistor is an N-channel CMOS transistor.

23. A driver, comprising:

a pull up transistor for switching the output of said driver to a high voltage;

a pull down transistor for switching the output of said driver to a low voltage;

a first pre-driver, said first pre-driver comprising one or more switching transistors for switching the output of said first pre-driver between a high voltage and a low voltage and one or more additional transistors for controlling the current transmitted to the output of said first pre-driver, said output of said first pre-driver providing a gate signal for said pull up transistor having a controlled slew rate; and a second pre-driver, said second pre-driver comprising one or more switching transistors for switching the output of said second pre-driver between a high voltage and a low voltage and one or more additional transistors for controlling the current transmitted by the output of said second pre-driver, said output of said second pre-driver providing a gate signal for said pull down transistor having a controlled slew rate.

24. A driver as in claim 23, wherein
said one or more switching transistors for switching the output of said first pre-driver between a high voltage and a low voltage comprises a pull up transistor for switching the output of said first pre-driver to a high voltage and a pull down transistor for switching the output of said first pre-driver to a low voltage and said one or more additional transistors for controlling the current transmitted to the output of said first pre-driver comprises a first transistor coupled to said pull up transistor for controlling the current transmitted from said first pre-driver when the output of said first pre-driver is at the high voltage and a second transistor coupled to said pull down transistor for controlling the current transmitted from said first pre-driver when the output of said first pre-driver is at the low voltage; and
said one or more switching transistors for switching the output of said second pre-driver between a high voltage and a low voltage comprises a pull up transistor for switching the output of said second pre-driver to a high voltage and a pull down transistor for switching the output of said second pre-driver to a low voltage and said one or more additional transistors for controlling the current transmitted to the output of said second pre-driver comprises a first transistor coupled to said pull up transistor for controlling the current transmitted from said second pre-driver when the output of said second pre-driver is at the high voltage and a second transistor coupled to said pull down transistor for controlling the current transmitted from said second pre-driver when the output of said second pre-driver is at the low voltage.

25. A driver as in claim 24, wherein said pull up transistors comprise P-channel CMOS transistors, said pull down transistors comprise N-channel CMOS transistors, said first transistors comprise P-channel CMOS transistors and said second transistors comprise N-channel CMOS transistors.

26. A driver as in claim 23, further comprising a first transistor coupled to said pull up transistor for controlling the current transmitted to a load connected to said driver when the output of said driver is at the high voltage and a second transistor coupled to said pull down transistor for controlling the current transmitted to a load connected to said driver when the output of said driver is at the low voltage.

27. A driver as in claim 26, wherein said first transistor is a current mirror transistor and second transistor is a current mirror transistor.

28. A driver as in claim 26, wherein said first transistor is a P-channel CMOS transistor and said second transistor is an N-channel CMOS transistor.

29. A driver as in claim 23, wherein said driver is fabricated on an integrated circuit chip and is adapted to drive a load located off of said chip.

30. A method of controlling a driver, comprising:
switching the output of said driver to a high voltage using a pull up transistor;
switching the output of said driver to a low voltage using a pull down transistor;
providing a gate signal for said pull up transistor having a controlled slew rate using a first pre-driver having one or more switching transistors for switching the output of said first pre-driver between a high voltage and a low voltage and one or more additional transistors for controlling the current transmitted to the output of said first pre-driver; and
providing a gate signal for said pull down transistor having a controlled slew rate using a second pre-driver having one or more switching transistors for switching the output of said second pre-driver between a high voltage and a low voltage and one or more additional transistors for controlling the current transmitted by the output of said second pre-driver.

31. A method as in claim 30, wherein
said one or more switching transistors for switching the output of said first pre-driver between a high voltage and a low voltage comprises a pull up transistor for switching the output of said first pre-driver to a high voltage and a pull down transistor for switching the output of said first pre-driver to a low voltage and said one or more additional transistors for controlling the current transmitted to the output of said first pre-driver comprises a first transistor coupled to said pull up transistor for controlling the current transmitted from said first pre-driver when the output of said first pre-driver is at the high voltage and a second transistor coupled to said pull down transistor for controlling the current transmitted from said first pre-driver when the output of said first pre-driver is at the low voltage; and
said one or more switching transistors for switching the output of said second pre-driver between a high voltage and a low voltage comprises a pull up transistor for switching the output of said second pre-driver to a high voltage and a pull down transistor for switching the output of said second pre-driver to a low voltage and said one or more additional transistors for controlling the current transmitted to the output of said second pre-driver comprises a first transistor coupled to said pull up transistor for controlling the current transmitted from said second pre-driver when the output of said second pre-driver is at the high voltage and a second transistor coupled to said pull down transistor for controlling the current transmitted from said second pre-driver when the output of said second pre-driver is at the low voltage.

32. A method as in claim 31, wherein said pull up transistors comprise P-channel CMOS transistors, said pull down transistors comprise N-channel CMOS transistors, said first transistors comprise P-channel CMOS transistors and said second transistors comprise N-channel CMOS transistors.

33. A method as in claim 30, further comprising controlling the current transmitted to a load connected to said driver when the output of said driver is at the high voltage using a first transistor coupled to said pull up transistor and controlling the current transmitted to a load connected to said driver when the output of said driver is at the low voltage using a second transistor coupled to said pull down transistor.

34. A method as in claim 33, wherein said first transistor is a current mirror transistor and second transistor is a current mirror transistor.

35. A method as in claim 33, wherein said first transistor is a P-channel CMOS transistor and said second transistor is an N-channel CMOS transistor.

36. A method as in claim 33, wherein said driver is fabricated on an integrated circuit chip and is adapted to drive a load located off of said chip.

* * * * *